United States Patent [19]

Bakhmutsky

[11] Patent Number: 5,663,726
[45] Date of Patent: Sep. 2, 1997

[54] HIGH SPEED VARIABLE-LENGTH DECODER ARRANGEMENT WITH REDUCED MEMORY REQUIREMENTS FOR TAG STREAM BUFFERING

[75] Inventor: Michael Bakhmutsky, Spring Valley, N.Y.

[73] Assignee: U.S. Philips Corporation, New York, N.Y.

[21] Appl. No.: 565,771

[22] Filed: Dec. 1, 1995

[51] Int. Cl.$^6$ .............................. H03M 7/40; H03M 7/46
[52] U.S. Cl. .................................... 341/67; 341/63
[58] Field of Search ................................ 341/63, 65, 67

[56] References Cited

U.S. PATENT DOCUMENTS

| | | | |
|---|---|---|---|
| 4,899,149 | 2/1990 | Kahan | 341/67 |
| 5,055,841 | 10/1991 | Cordell | 341/67 |
| 5,062,125 | 10/1991 | Langlais et al. | 341/67 |
| 5,173,695 | 12/1992 | Sun et al. | 341/67 |
| 5,181,031 | 1/1993 | Tong et al. | 341/65 |
| 5,208,593 | 5/1993 | Tong et al. | 341/65 |
| 5,245,338 | 9/1993 | Sun | 341/67 |
| 5,254,991 | 10/1993 | Ruetz et al. | 341/65 |
| 5,363,097 | 11/1994 | Jan | 341/67 |
| 5,491,480 | 2/1996 | Jan et al. | 341/67 |

*Primary Examiner*—Howard L. Williams
*Attorney, Agent, or Firm*—Edward W. Goodman

[57] ABSTRACT

A variable-length decoder arrangement having enhanced speed capacity, in which an input bit stream is tagged with the codeword boundary information by a tree-searching state machine. In order to reduce the memory requirements of the tag buffer, run-length encoding techniques are used to compress the tag information. This compressed tag information is used in a closed-loop parsing loop wherein a compressed tag stream length conversion table decoder is used to determine the length of the compressed tag codewords which are used to control the barrel shifter in the closed-loop parsing loop, while the compressed tag codewords are decoded into actual word-lengths in a word-length conversion table decoder. These actual word-lengths are then accumulated and used to control a barrel shifter for decoding the variable-length bit stream.

5 Claims, 3 Drawing Sheets

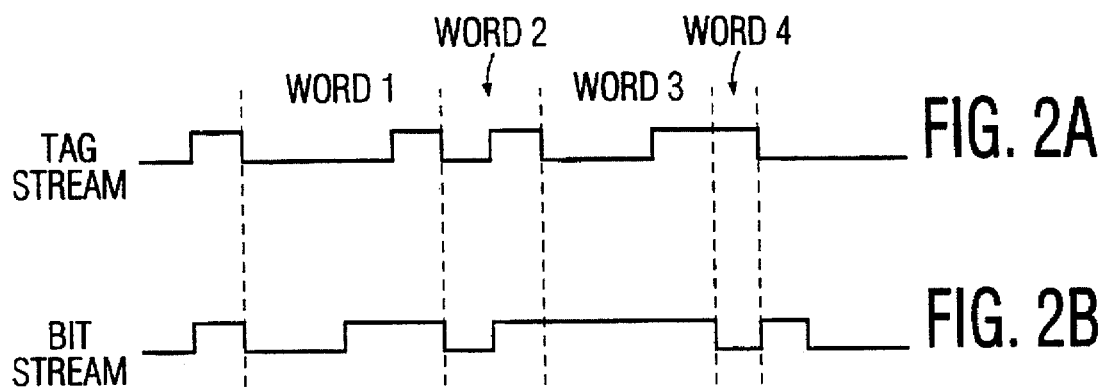
FIG. 2A
FIG. 2B
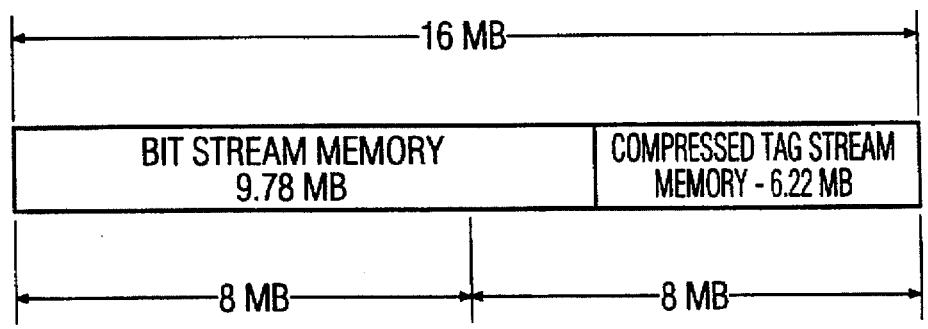
FIG. 4

HIGH SPEED VARIABLE-LENGTH DECODER ARRANGEMENT WITH REDUCED MEMORY REQUIREMENTS FOR TAG STREAM BUFFERING

BACKGROUND OF THE INVENTION

1. Field of The Invention

The subject invention relates to a method and apparatus for decoding statistically encoded bit streams consisting of words having variable bit lengths.

Variable-length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the averaged word-length of the variable-length codewords is shorter than that of the original data and, therefore, data compression is achieved. The Huffman code design is a procedure commonly used to construct a minimum redundant variable-length code for a known data statistic. Generally, the encoding process can be implemented by a table look-up process using the input data to address the table. The codewords and word lengths are stored as table contents, and the codewords are outputted sequentially, through a buffer, at a constant data rate onto the data channel. At the receiving end, however, the decoding process is more complicated. Due to the variable-length nature, each codeword has to be segmented from the received bit stream before it can be decoded into a source symbol. Therefore, the design of a variable-length decoder is always more difficult than the design of a variable-length encoder.

2. Description of the Related Art

There are several methods to decode a sequence of variable-length code words. The most important ones are the tree searching algorithm and the table look-up technique.

A variable-length code can always be represented by a tree with codewords as leaves (also called terminal nodes). The decoding starts from the root of the code tree and is guided by the received bit stream to follow one of two branches at each node. When a leaf is reached, the end of a codeword is detected and it is segmented from the remaining string. This type of decoder includes logic circuitry corresponding to the tree and control circuitry to traverse the code tree. This approach may be slow, especially for long codewords, since a bit-by-bit search through the code tree is required for each decoded symbol. In typical applications, an input symbol is represented by several bits. The speed of shifting received bits into a decoder is several times as high as the averaged speed of decoded data. Therefore, the tree searching-based decoder has to be operated at the speed of several times the output data rate.

Such high speed requirements are particularly critical for the digital transmission of high definition television (HDTV) signals. In such an HDTV system, the total sample rate (combined luminance and chrominance signals) is likely to be 100 MHz.

A table look-up technique is an alternative to the bit-by-bit search approach. In a table look-up technique, the received bit stream is compared with the contents of a codeword table. The codeword table has an entry associated with each possible variable-length codeword that includes the decoded fixed-length word and the length of the variable-length word. When the sequence of leading bits in an input register matches one of the entries in the codeword table, a codeword match is indicated. The input register is then shifted by the number of bits indicated by the code-length entry, thereby making the next sequence of bit available for comparison with entries in the codeword table. Disadvantageously, bit-by-bit shifting at the very high speed multiple of the sample rate is required to enable the decoder to maintain the sample rate of decoding.

A high-speed flexible variable-length-code decoder of the table look-up type includes a barrel shifter that provides an output decoding window having a bit-width equal to the maximum length codeword. In response to a control signal, the barrel shifter directly shifts its decoding window across a sequence of available input bits as each codeword is detected. The decoding window is shifted after each codeword is decoded by the number of bits corresponding to the length of the last decoded codeword. The table look-up decoder is capable of decoding at the symbol rate regardless of the word-length.

U.S. Pat. No. 5,173,695 to Sun et al., discloses a table look-up decoder of the above type. However, its actual speed of operation is limited by the propagation delay through the feedback loop consisting of the barrel shifter, the word-length decoder and the adder. The word-length decoder represents the most complex, and therefore, the slowest part of the path. In MPEG-2 applications, for example, there are multiple tables corresponding to particular types of codewords, which are not only complex by themselves, but their multiplexing and, sometimes, use of arithmetic operations, are required before the result of proper length computation is delivered to the adder.

In current implementations, the systems are normally partitioned into multiple processing paths, the variable-length decoder being one of the major bottlenecks. Since multiple variable-length decoders cannot access the rate buffer directly, multiple dedicated ping-pong buffers are normally implemented between all the variable-length decoders and the rate buffer, increasing the amount of the bit stream memory required for the system. For example, the system implemented in 8 partitions requires 8 ping-pong buffers, each one of these buffers having twice the size of the rate buffer, thereby increasing the amount of buffer memory by the factor of 16. For the duration of the picture, each one of these ping-pong buffers reads the picture partition designated for decoding by its variable-length decoder in the next picture cycle while the variable-length decoder is decoding the portion of the bit stream stored in the other bank of the ping-pong buffer.

Co-pending U.S. patent application Ser. No. 08/565,773, filed concurrently with the subject application, by Applicant, entitled "HIGH-SPEED VARIABLE-LENGTH DECODER ARRANGEMENT" (1504-1035), discloses a variable-length decoder arrangement in which speed enhancement is achieved by tagging the bit stream before the rate buffer with the codeword boundary information and by replacing the slowest part of the critical length decoding loop with a simple codeword-type-independent fixed look-up table decoder, or eliminating this loop altogether.

As in the prior art, a look-up table decoder with a barrel shifter is used. However, the subject invention takes advantage of the fact that the lengths of the codewords can be easily determined before the bit stream is entered into the rate buffer. The variable-length decoder used after the rate buffer has to be able to decode codewords at very high peak rates since, for the actual display time of the picture, it may have to extract the whole picture from the rate buffer, which may have even more codewords than there are samples in the picture. This problem is especially severe in HDTV applications where the amount of information passed through the decoding circuits is very high.

It should be understood that the variable-length decoder may be used in front of a buffer, at which point such a demanding peak codeword rate requirement does not exist. As such, the variable-length decoder may run at a much slower rate. However, the uncompressed decoded information at the output of the variable-length decoder requires much more memory in the buffer, which is a significant cost factor for the HDTV set. This is why variable-length decoders are normally used after a rate buffer.

Since there is no peak codeword rate requirement for bit stream decoding before the rate buffer, a relatively slow state machine can be used in front of the rate buffer whose only purpose is to mark the word boundaries of the bit stream. This information can be passed to the variable-length decoder, used after the rate buffer, along with the bit stream, easing its task of word-length computation.

The variable-length decoder arrangement described above significantly improves the speed of operation of the variable length decoder by reducing the propagation delays in its word-length decoding loop. This results in more efficient, implementation of HDTV decoders, particularly, using a single variable-length decoder per system. However, the disadvantage of the above arrangement is that the amount of memory required for tag buffering is substantially equal to the amount of memory required for bit stream buffering before the variable-length decoder. This significantly increases the cost of implementation.

SUMMARY OF THE INVENTION

An object of the subject invention is to enhance the speed of operation of the variable-length decoder by speeding up the word-length decoding loop, while, at the same time, keeping the cost for doing the same at a minimum.

This object is achieved in a variable-length decoder arrangement for decoding an input bit stream of variable-length codewords comprising a tree-searching state machine having a data input for receiving the input bit stream and an enable input for receiving an enable signal, said tree-searching state machine executing a decoding protocol and tagging the end of every codeword; a delay equalizer having a data input for receiving the input bit stream and an enable input for receiving the enable signal, said delay equalizer compensating for a delay of the tree-searching state machine; a run-length encoder coupled to an output of said tree-searching state machine; a first format converter having an input coupled to an output of said run-length encoder, and a second format converter having an input coupled to an output of said delay equalizer, said first and second format converters each bussing an applied data stream to a predetermined width for accommodating the longest codeword in a selected protocol; a rate buffer having an input coupled to an output of the second format converter; a tag buffer having an input coupled to an output of the first format converter, said tag buffer having a memory size smaller than that of said rate buffer; and a variable-length decoder having first input means coupled to an output of the tag buffer, and second input means coupled to an output of the rate buffer, the variable-length decoder comprising a closed-loop parsing loop having an input coupled to the first input means of the variable-length decoder, said closed-loop parsing loop comprising first register means having input means coupled to the input of said closed-loop parsing loop; a first barrel shifter having data input means coupled to output means of said first register means, anda shift-control input; a compressed tag stream length conversion table decoder, said compressed tag stream length conversion table decoder having an input coupled to an output of said first barrel shifter for receiving an input for said compressed tag stream length conversion table decoder; a first adder having a first input coupled to an output of said compressed tag stream length conversion table decoder; second register means having an input coupled to an output of said first adder, said second register having an output coupled both to a second input of said first adder, and to the shift-control input of said first barrel shifter; and a word-length conversion table decoder, said word-length conversion table decoder having an input also coupled to the output of said first barrel shifter for receiving an input signal for said word-length conversion table decoder, and an output coupled to an output of said closed-loop parsing loop; a decoding section having a first input coupled to the second input means of said variable-length decoder, and a second input coupled to the output of said closed-loop parsing loop, said decoding section comprising third register means having input means coupled to said first input of said decoding section; a second barrel shifter having data input means coupled to an output of said register means, and a shift-control input; a value decoder having an input coupled to an output of said second barrel shifter, said value decoder interpreting a bit stream at the output of the second barrel shifter and converting the bit stream into actual data values, said value decoder having an output coupled to an output of the decoding section which constitutes an output of the variable-length decoder arrangement; a serial memory having an input coupled to the second input of said decoding section; a second adder having a first input coupled to an output of said serial memory; and fourth register means having an input coupled to an output of said second adder, and an output coupled both to a second input of said second adder, and to the shift-control input of said second barrel shifter; and a state machine coupled to the decoding section and the closed-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

In order to reduce the amount of memory required for tag stream buffering, run-length encoding techniques are used to compress the tag stream before writing it into the tag buffer. Run-length encoding techniques are well known in the art of digital communications and are widely used in protocols, for example, MPEG-2, to achieve high compression ratios.

The unique characteristic of the tag stream is that the tagging "level" is always fixed at the value of logical "one" while the "run" represents the number of logical "zeros" in front of the fixed "level". The compression efficiency for this simplified stream should at least be as good as or better than that for the bit streams with variable "level" depending on coding efficiency. The number of codes in the run-length table should be small and limited to the length of the longest codeword less all invalid word lengths (23 in MPEG-2).

BRIEF DESCRIPTION OF THE DRAWINGS

With the above and additional objects and advantages in mind as will hereinafter appear, the invention will be described with reference to the accompanying drawings, in which:

FIGS. 2A and 2B show timing diagrams of the bit stream at the output of the tree-searching state machine, and the delayed input bit stream in FIG. 1;

FIG. 4 shows, in block diagram form, an example of memory utilization for a single memory device for both tag and rate buffering.

DESCRIPTION OF THE PREFERRED EMBODIMENTS

Figure 1:
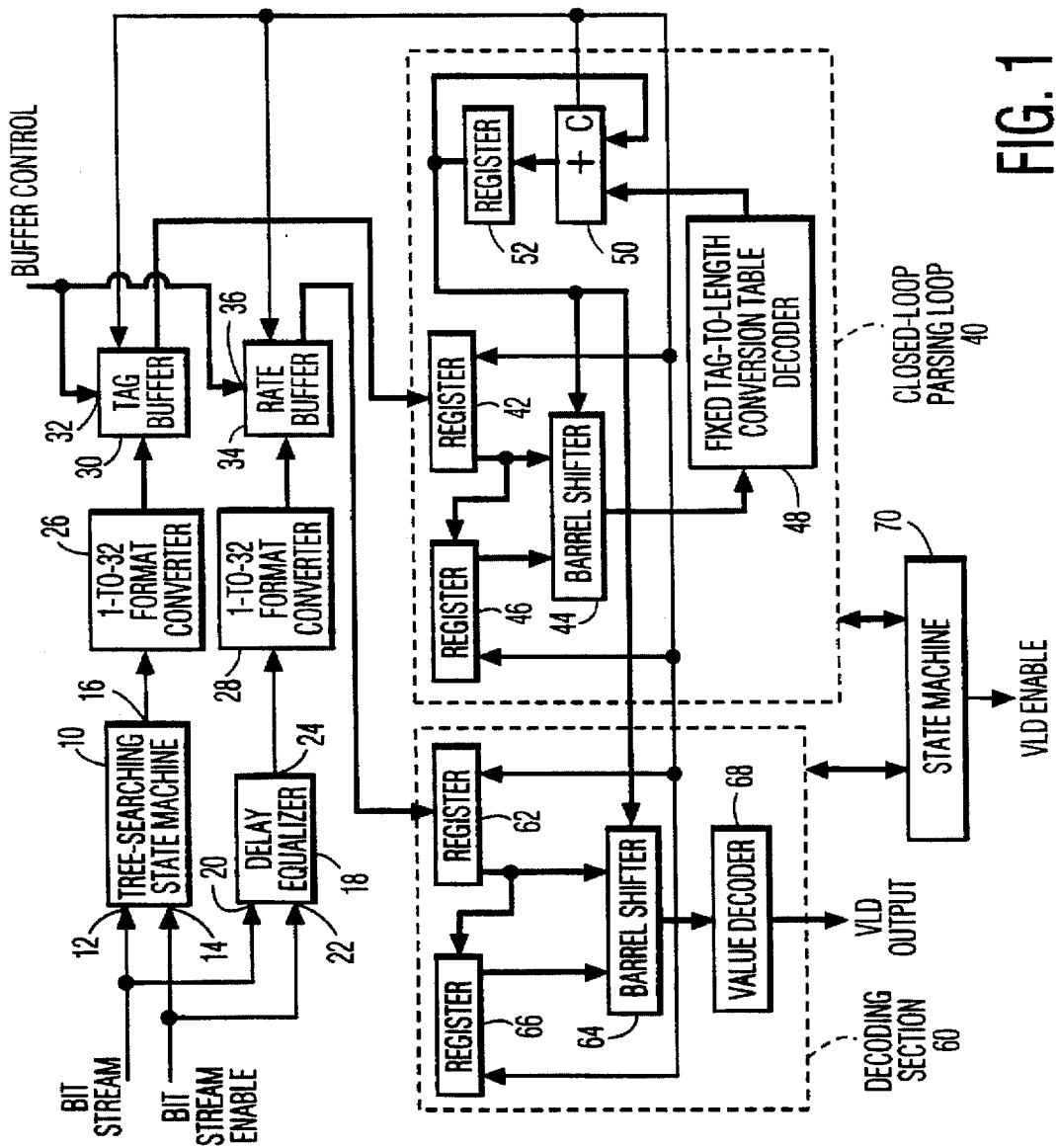
FIG. 1 is a block diagram of a variable-length decoder arrangement without the enhancements of the subject invention.

FIG. 1 shows a closed loop implementation of a variable-length decoder arrangement. In particular, a tree-searching state machine 10 receives, at its data input 12, an input bit stream and, at an enable input 14, a bit stream enable signal. The bit stream has a width of 1 bit for easier implementation. The bit stream is valid only when the enable signal is active. This is necessary to accommodate for burstiness in the data due to prior processing in the transport circuits (not shown). The tree-searching state machine 10, controlled by the bit stream, executes a decoding protocol, tagging the end of every codeword with, for example, an active "high" level at its single output 16. To compensate for a few clock cycles of delay in the tree-searching state machine 10, the input bit stream is also applied to a data input 20 of a delay equalizer 18, which also has an enable input 22 to which the bit stream enable signal is applied. At the output 24 of the delay equalizer 18 and the output 16 of the tree-searching state machine 10, both bit streams are aligned in time as shown in the timing diagrams of FIGS. 2A and 2B. It should be noted that while the bit stream enable signal is required by subsequent components in the variable-length decoder arrangement, for clarity, the bit stream enable signal is only shown in FIG. 1 applied to the tree-searching state machine 10, and the delay equalizer 18.

The outputs from the tree-searching state machine 10 and the delay equalizer 18 are applied to respective 1-to-32 format converters 26 and 28. The 1-to-32 format converters 26 and 28 buss the respective bit streams for proper processing by the variable-length decoder. The widths of the bussed streams must be able to accommodate the longest codeword in the protocol for proper operation of the barrel shifter-based variable-length decoder. In the MPEG-2 protocol, this number is 32.

The outputs from the 1-to-32 format converters 26 and 28 are applied, respectively, to a tag buffer 30 and a rate buffer 34. The tag buffer 30 and the rate buffer 34 receive buffer control signals at respective control inputs 32 and 36 from buffer control circuits (not shown).

The variable-length decoder consists of two sections, a closed-loop parsing loop 40 and a decoder section 60. The closed-loop parsing loop 40 includes a register 42 to which the output from the tag buffer 30 is applied. The output from register 42 is applied to a first set of parallel data inputs of a barrel shifter 44. The output from register 42 is also applied to a register 46, the output therefrom being applied to a second set of parallel data inputs of the barrel shifter 44. The output from the barrel shifter 44 is applied to an input of a fixed tag-to-length conversion table decoder 48, in which the tag stream from the output of the barrel shifter 44 is converted into the actual word-lengths. The fixed tag-to-length conversion table decoder 48 is a codeword-type-independent look-up table, in which the table does not depend on a type of currently decoded codeword, since the decoding is done earlier. The idea is to make this table decoder simple, fixed and independent of the actual bit stream. The data output from the fixed tag-to-length conversion table decoder 48 is applied to a first input of an adder 50, the output from the adder 48 being applied to a register 52. The output from the register 52 is applied to a second input of the adder 50, to the shift-control input of the barrel shifter 44, and to the output of the closed-loop parsing loop 40. An overflow output C of the adder 50 is applied to the tag buffer 30, the rate buffer 34, and the registers 42 and 46 for controlling the timing of the arrangement.

The closed-loop parsing loop 40 is dedicated to controlling the barrel shifter 44 therein (and one in the decoding section 60) and requesting new data from the tag buffer 30 and the rate buffer 34. The barrel shifters are controlled in such a way that the sliding decoding windows always contain the current codeword in the decoding section 60 and the aligned codeword boundary tag stream in the closed-loop parsing loop 40.

Since the codeword boundary information is available in the closed-loop parsing loop 40 in the form of bits set "high" at the end of each codeword in the bit stream, it is very easy to convert this information into the actual word-lengths using the fixed tag-to-length conversion table decoder 48, as shown below in Table I:

TABLE I

| WORD BOUNDARY TAG STREAM AT THE OUTPUT OF BARREL SHIFTER 46 | | CODE-WORD |
|---|---|---|
| 1XXXXXXXXXXXXXXXXXXXXXXXXXXXXXXXX | → | 1 |
| 01XXXXXXXXXXXXXXXXXXXXXXXXXXXXXXX | → | 2 |
| 001XXXXXXXXXXXXXXXXXXXXXXXXXXXXXX | → | 3 |
| 0001XXXXXXXXXXXXXXXXXXXXXXXXXXXXX | → | 4 |
| 00001XXXXXXXXXXXXXXXXXXXXXXXXXXXX | → | 5 |
| 000001XXXXXXXXXXXXXXXXXXXXXXXXXXX | → | 6 |
| 0000001XXXXXXXXXXXXXXXXXXXXXXXXXX | → | 7 |
| 00000001XXXXXXXXXXXXXXXXXXXXXXXXX | → | 8 |
| 000000001XXXXXXXXXXXXXXXXXXXXXXXX | → | 9 |
| 0000000001XXXXXXXXXXXXXXXXXXXXXXX | → | 10 |
| 00000000001XXXXXXXXXXXXXXXXXXXXXX | → | 11 |
| 000000000001XXXXXXXXXXXXXXXXXXXXX | → | 12 |
| 0000000000001XXXXXXXXXXXXXXXXXXXX | → | 13 |
| 00000000000001XXXXXXXXXXXXXXXXXXX | → | 14 |
| 000000000000001XXXXXXXXXXXXXXXXXX | → | 15 |
| 0000000000000001XXXXXXXXXXXXXXXXX | → | 16 |
| 00000000000000001XXXXXXXXXXXXXXXX | → | 17 |
| 000000000000000001XXXXXXXXXXXXXXX | → | 18 |
| 0000000000000000001XXXXXXXXXXXXXX | → | 19 |
| 00000000000000000001XXXXXXXXXXXXX | → | 20 |
| 000000000000000000001XXXXXXXXXXXX | → | 21 |
| 0000000000000000000001XXXXXXXXXXX | → | 22 |
| 00000000000000000000001XXXXXXXXXX | → | 23 |
| 000000000000000000000001XXXXXXXXX | → | 24 |
| 0000000000000000000000001XXXXXXXX | → | 25 |
| 00000000000000000000000001XXXXXXX | → | 26 |
| 000000000000000000000000001XXXXXX | → | 27 |
| 0000000000000000000000000001XXXXX | → | 28 |
| 00000000000000000000000000001XXXX | → | 29 |
| 000000000000000000000000000001XXX | → | 30 |
| 0000000000000000000000000000001XX | → | 30 |
| 00000000000000000000000000000001X | → | 31 |
| 000000000000000000000000000000001 | → | 0 |

According to Table I, the length of a codeword is determined by the first "high" bit after an uninterrupted series of "low" bits. For example, the codeword whose tag stream starts with "0001 . . . " will have the length of four bits, "1" being the tag identifying the end of the codeword. Due to the wrap around nature of the barrel shifter 44, 32 is equivalent to 0.

The tag-to-length conversion table is not dependent on the bit stream information and can easily be implemented in silicon with minimal propagation delays. No multiplexing of word-length tables or arithmetic operations are required.

The decoding section 60 includes a register 62 for receiving the bit stream at the output of the rate buffer 34. An output from the register 62 is applied to a first set of data inputs of a barrel shifter 64, and to an input of a register 66, the output therefrom being applied to a second set of data inputs of barrel shifter 64. The output from the closed-loop parsing loop 40 (originating from the register 52) is applied to a shift-control input of the barrel shifter 64. The decoding section 60 does not require a feedback loop. Rather, the output from the barrel shifter 64 is applied directly to a value decoder 68 which interprets the bit stream by converting it into the actual data values. This process is not timing critical and as such, can be pipelined. It should be noted that the overflow output C of the adder 50 is also applied to the registers 62 and 66 for controlling the timing thereof.

The output from the value decoder 68 forms the output from the decoding section 60 and, accordingly, the output of the variable-length decoder arrangement of the subject invention.

The closed-loop parsing loop 40 and the decoding section 60 are controlled by a state machine 70 which executes the decoding protocol based on the bit stream contents. The state machine 70 controls the value decoder 68 by selecting its appropriate decoding value tables and interrupts the data requests from the tag buffer 30 and the rate buffer 34 when the picture is decoded.

As noted above, while this variable-length decoder arrangement does achieve high speeds, a downside is the amount of memory required for the tag buffer 30, which is substantially equal to that required by the rate buffer 34.

Figure 3:
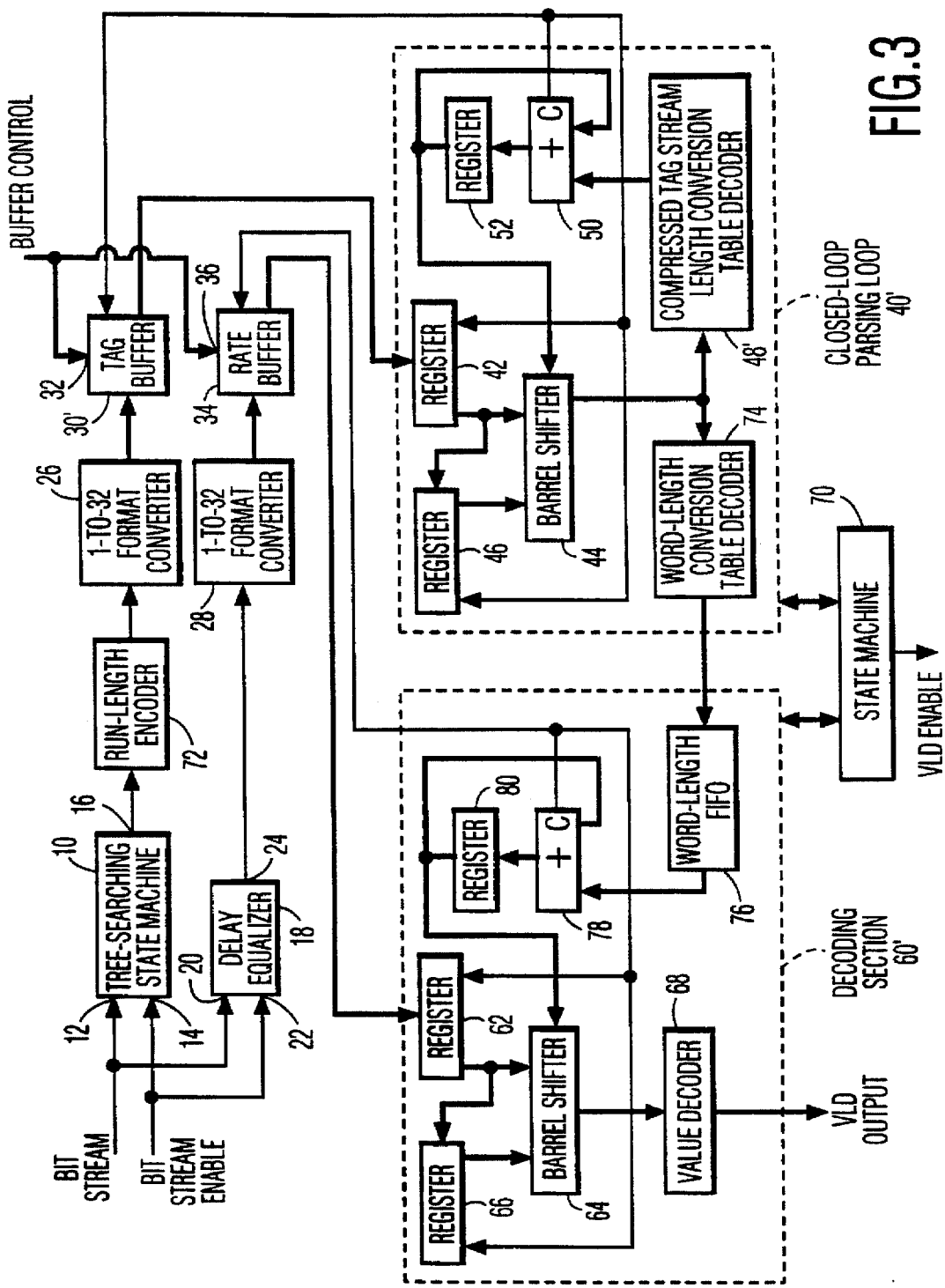
FIG. 3 shows a block diagram of an embodiment of the variable-length decoder arrangement of the subject invention.

FIG. 3 shows an embodiment of a variable-length decoder arrangement incorporating the subject invention. Components identical to those in FIG. 1 bear the same reference number.

In particular, a codeword length value from the output of the tree-searching state machine 10 is now applied to a run-length encoder 72, which applies its output compressed codeword length value signal to the 1-to-32 format converter 26. The tag buffer 30' is now coupled to the output of the 1-to-32 format converter 26.

The fixed tag-to-length conversion table decoder 48 in FIG. 1 is now replaced by a compressed tag stream length conversion table decoder 48'. The output from the register 52 is now applied only to the second input of the adder 50, and to the shift-control input of the barrel shifter 44. The closed-loop parsing loop 40' now includes a word-length conversion table decoder 74 having an input also coupled to the output of the barrel shifter 44 and an output coupled to an output of the closed-loop parsing loop 40'. The word-length conversion table decoder 74 is controlled by the output from the barrel shifter 44.

In the decoding section 60', the second input is coupled to the input of a serial memory, for example, first-in-first-out (FIFO) memory 76 having an output coupled to a first input of a second adder 78. An output of the second adder 78 is coupled to an input of a register 80. An output of the register 80 is coupled to a second input of the second adder 78, and to the shift-control input of the barrel shifter 64.

The run-length encoder 72 is added between the tree searching state machine 10 and the format converter 26 in order to compress the word boundary tag stream. The compressed tag stream is bussed and written into the smaller size tag buffer 30'.

The compressed tag information is read from the tag buffer 30' into the closed-loop parsing loop 40'. Therein, the compressed tag stream length conversion table decoder 48' is used to determine the lengths of the Compressed tag codewords. At the same time, the compressed tag codewords are decoded into the actual word-lengths in the word-length conversion table decoder 74 which are then stored in the word-length FIFO memory 76. The bit stream word-lengths are read from the FIFO memory 76 and applied to the adder-accumulator section (adder 78 and register 80) every time a new codeword is being decoded.

When the tag bit stream is compressed in the run-length encoder 72, synchronization between the tag bit stream and the codeword bit stream is lost. Hence, overflow output C of the adder 50 in the closed-loop parsing loop 40' is used for timing of only the tag buffer 30' and the registers 42 and 46. Similarly, the overflow output C of the adder 78 in the decoding section 60' is used for the timing of only the rate buffer 34 and the registers 62 and 66. Synchronization between the two bit streams is effected by the FIFO 76 connected between the output of the word length conversion table decoder 74 and the input of the adder 78

A practical implementation of memory utilization using the subject invention is shown in FIG. 4 for an MPEG-2 main profile high-level HDTV decoder. The total amount of memory required for bit stream buffering is 9.78 Mbits. Implementing this memory size is possible using a single 16-Mbit memory device or a combination of an 8-Mbit memory device and a 2-Mbit memory device. The second solution is less cost efficient. On one hand, the cost per one Mbit of memory is higher, and, on the other hand, the cost of printed circuit board becomes more expensive with the higher number of components on the board. This justifies using a monolithic 16-Mbit memory device for storing both bit stream and tag stream information. The amount of memory in this device remaining for tag stream storage is equal to 6.22 Mbits. The compression ratio required for this application is thus 9.78/6.22=1.57, which is achievable with run-length techniques, especially with fixed "level".

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A variable-length decoder arrangement for decoding an input bit stream of variable-length codewords comprising:

a tree-searching state machine having a data input for receiving the input bit stream and an enable input for receiving an enable signal, said tree-searching state machine executing a decoding protocol and tagging the end of every codeword;

a delay equalizer having a data input for receiving the input bit stream and an enable input for receiving the enable signal, said delay equalizer compensating for a delay of the tree-searching state machine;

a run-length encoder coupled to an output of said tree searching state machine;

a first format converter having an input coupled to an output of said run-length encoder, and a second format converter having an input coupled to an output of said delay equalizer, said first and second format converters each bussing an applied data stream to a predetermined width for accommodating the longest codeword in a selected protocol;

a rate buffer having an input coupled to an output of the second format converter;

a tag buffer having an input coupled to an output of the first format converter, said tag buffer having a memory size smaller than that of said rate buffer; and a variable-length decoder having first input means coupled to an output of the tag buffer, and second input means coupled to an output of the rate buffer, the variable-length decoder comprising:

a closed-loop parsing loop having an input coupled to the first input means of the variable-length decoder, said closed-loop parsing loop comprising:

first register means having input means coupled to the input of said closed-loop parsing loop;

a first barrel shifter having data input means coupled to output means of said first register means, and a shift-control input;

a compressed tag stream length conversion table decoder having an input coupled to an output of said first barrel shifter for receiving an input for said compressed tag stream length conversion table decoder;

a first adder having a first input coupled to an output of said compressed tag stream length conversion table decoder;

second register means having an input coupled to an output of said first adder, said second register having an output coupled to a second input of said first adder, and to the shift-control input of said first barrel shifter; and a word-length conversion table decoder having an input also coupled to the output of said first barrel shifter, and an output coupled to an output of said closed-loop parsing loop;

a decoding section having a first input coupled to the second input means of said variable-length decoder, and a second input coupled to the output of said closed-loop parsing loop, said decoding section comprising:

third register means having input means coupled to said first input of said decoding section;

a second barrel shifter having data input means coupled to an output of said register means, and a shift-control input;

a value decoder having an input coupled to an output of said second barrel shifter, said value decoder interpreting a bit stream at the output of the second barrel shifter and converting the bit stream into actual data values, said value decoder having an output coupled to an output of the decoding section which constitutes an output of the variable-length decoder arrangement;

a serial memory having an input coupled to the second input of said decoding section;

a second adder having a first input coupled to an output of said serial memory; and fourth register means having an input coupled to an output of said second adder, and an output coupled both to a second input of said second adder, and to the shift-control input of said second barrel shifter; and a state machine coupled to the decoding section and the closed-loop parsing loop for executing the decoding protocol based on the bit stream contents, the state machine controlling the value decoder by selecting appropriate decoding value tables for the value decoder and interrupting the data requests from the tag buffer and the rate buffer when a picture represented by the input bit stream is decoded.

2. The variable-length decoder arrangement as claimed in claim 1, wherein the first register means comprises:

a first register having input means coupled to the input of said closed-loop parsing loop; and a second register having input means coupled to an output of said first register, said data input means of said first barrel shifter comprising a first set of data inputs coupled to the output of said first register, and a second set of data inputs coupled to an output of said second register.

3. The variable-length decoder arrangement as claimed in claim 1, wherein the third register means comprises:

a first register having input means coupled to the first input of said decoding section; and a second register having input means coupled to an output of said first register, said data input means of said second barrel shifter comprising a first set of data inputs coupled to the output of said first register, and a second set of data inputs coupled to an output of said second register.

4. The variable-length decoder arrangement as claimed in claim 1, wherein said first and second format converters are 1-to-32 format converters.

5. The variable-length decoder arrangement as claimed in claim 1, wherein said rate buffer and said tag buffer are incorporated in a single 16-Mbit memory chip, said rate buffer having a memory size of 9.78 Mbits, and said tag buffer having a memory size of 6.22 Mbits, and the run-length encoder has a compression ratio greater than 1.57.

* * * * *